United States Patent
Ishikawa et al.

(10) Patent No.: US 8,916,406 B2
(45) Date of Patent: Dec. 23, 2014

(54) ORGANIC ELECTROLUMINESCENCE DEVICE AND PRODUCTION METHOD THEREOF

(75) Inventors: Wataru Ishikawa, Tokyo (JP); Tadashi Sekiguchi, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 832 days.

(21) Appl. No.: 13/142,083

(22) PCT Filed: Jan. 14, 2010

(86) PCT No.: PCT/JP2010/050326
§ 371 (c)(1),
(2), (4) Date: Jun. 24, 2011

(87) PCT Pub. No.: WO2010/084815
PCT Pub. Date: Jul. 29, 2010

(65) Prior Publication Data
US 2011/0253990 A1 Oct. 20, 2011

(30) Foreign Application Priority Data
Jan. 22, 2009 (JP) .................................. 2009-011752

(51) Int. Cl.
*H01L 21/00* (2006.01)
*H01L 51/00* (2006.01)
*H01L 51/50* (2006.01)

(52) U.S. Cl.
CPC ......... *H01L 51/0003* (2013.01); *H01L 51/0072* (2013.01); *H01L 51/0084* (2013.01); *H01L 51/0085* (2013.01); *H01L 51/0086* (2013.01); *H01L 51/0087* (2013.01); *H01L 51/0088* (2013.01); *H01L 51/50* (2013.01)
USPC 438/46; 257/401; 257/E51.001; 257/E51.024

(58) Field of Classification Search
CPC ..... H01L 27/32; H01L 51/005; H01L 21/288; H01L 33/502; H01L 51/56; H01L 51/50; H01L 51/0007; H01L 51/0029; H01L 51/0034; H01L 51/0037; H01L 51/0038; H01L 51/006; H01L 51/0061
USPC ................. 257/40, E51.001, E51.024; 438/46
See application file for complete search history.

(56) References Cited

U.S. PATENT DOCUMENTS

2009/0173937 A1 7/2009 Aernouts et al.

FOREIGN PATENT DOCUMENTS

| JP | 2002-359072 | 12/2002 |
|----|-------------|---------|
| JP | 2003-138033 | 5/2003 |
| JP | 2005-085731 | 3/2005 |
| JP | 2006-244806 | 9/2006 |
| JP | 2007-280623 | 10/2007 |
| JP | 2007-321023 | 12/2007 |
| JP | 2008-041302 | 2/2008 |
| JP | 2008-140620 | 6/2008 |

*Primary Examiner* — Wael Fahmy
*Assistant Examiner* — Sarah Salerno
(74) *Attorney, Agent, or Firm* — Lucas & Mercanti, LLP

(57) ABSTRACT

Disclosed is an organic electroluminescence device which can be stably produced by a wet process and exhibits enhanced external quantum efficiency and reduced coating unevenness and a production method thereof. Specifically, disclosed is a method of producing the organic electroluminescence device comprising at least a layer, which is formed by a wet process comprising of coating a solution of an organic material dissolved in a solvent to form a liquid layer, followed by removal of the solvent by blowing air to form the layer, wherein the relative drying rate of the solvent to butyl acetate is from 1 to 1000, (based on the drying rate of butyl acetate being 100), the thickness of the formed liquid layer is from 1 to 100 μm, a air-blowing rate is from 0.1 to 5 m/s and the time between completion of coating and start of blowing is from 0 to 60 sec.

5 Claims, No Drawings

ORGANIC ELECTROLUMINESCENCE DEVICE AND PRODUCTION METHOD THEREOF

CROSS REFERENCE TO RELATED APPLICATION

This is a 371 of PCT/JP2010/050326 filed Jan. 14, 2010, which in turn claimed the priority of Japanese Patent Application No. 2009-011752 filed Jan. 22, 2009, both applications are incorporated by reference herein.

TECHNICAL FIELD

The present invention relates to an organic electroluminescence device (also denoted as an organic EL device) and a production method of the same, and in particular, to an organic electroluminescence which can be produced by a wet process, exhibits enhanced external quantum efficiency and has been improved in coating uniformity, and a production method of the same.

TECHNICAL BACKGROUND

Organic electroluminescence includes a phosphorescing compound and a fluorescing compound and it is known that a phosphorescing compound exhibits higher external quantum efficiency. It is also known that in order to allow a phosphorescing material to perform efficient emission, providing a functional layer such as a hole transport layer, an emission layer, a hole transport layer or the like results in enhanced external quantum efficiency.

On the other hand, a production method of an organic EL by a wet process is noted in terms of enhanced use efficiency of materials.

However, problems arose with device production by a wet process, such as uneven emission due to coating mottle. It was also proved that devices produced by a wet process resulted in reduced external efficiency, compared to those produced by a process of vapor deposition.

There was described coating a polymeric material with a solvent (such as described in, for example, Patent document 1), however, there was no description with respect to a problem related to unevenness in coating a low molecular material and nothing was reported with respect to drying conditions. Further, there were descriptions regarding an achievement of enhanced external quantum efficiency of a device, which were related to polymeric materials, not including any low-molecular-weight material, and in which there was no consideration with respect to drying conditions (such as described in, for example, Patent document 3).

PRIOR-ART DOCUMENT

Patent Document

Patent document 1: JP 2006-244806A
Patent document 2: JP 2002-359072A
Patent document 3: JP 2008-140620A

SUMMARY OF THE INVENTION

Problem to be Solved in the Invention

The present invention has come into being in view of the foregoing problems. It is an object of the present invention to provide an organic electroluminescence device which can be stably produced by a wet process and exhibits enhanced external quantum efficiency and reduced coating unevenness.

Means for Solving the Problem

The object of the present invention can be achieved by the following constitution.

1. A method of producing an organic electroluminescence device comprising at least a layer, and the layer being formed by a wet process comprising the steps of coating a solution of an organic material dissolved in a solvent to form a liquid layer, and then removing the solvent by blowing air to form the layer, wherein the solvent exhibits a relative drying rate of from 1 to 1000, (based on the drying rate of butyl acetate being 100), a thickness of the formed liquid layer is from 1 μm to 100 μm, a blowing rate of the air is from 0.1 m/s to 5 m/s and a time lapse after coating and before blowing is from 0 sec. to 60 sec.

2. The method of producing an organic electroluminescence device, as described in the foregoing 1, wherein the solvent exhibits a boiling point of not less than 40° C. and less than 200° C.

3. The method of producing an organic electroluminescence device, as described in the foregoing 1 or 2, wherein the solvent is a mixture of at least a solvent exhibiting a relative drying rate of less than 50 in combination with a solvent exhibiting a relative drying rate of not less than 200.

4. The method of producing an organic electroluminescence device, as described in any one of the foregoing 1 to 3, wherein the organic material is a low molecular weight compound.

5. The method of producing an organic electroluminescence device, as described in any one of the foregoing 1 to 4, wherein the layer is a light-emitting layer.

6. The method of producing an organic electroluminescence device, as described in any one of the foregoing 1 to 5, wherein in the step of coating a solution, a dip coating method, a spin coating method, a blade coating method, or a slit coating method is used.

7. An electroluminescence device produced by a producing method, as described in any one of the foregoing 1 to 6.

EFFECT OF THE INVENTION

An organic electroluminescence device which can be stably produced by a wet process and exhibits enhanced external quantum efficiency and reduced coating unevenness and a production method thereof can be realized according to the present invention.

EMBODIMENTS OF THE INVENTION

Hereinafter, there will be detailed the present invention.

The present invention is featured in that a method of producing an organic electroluminescence device by the wet process that comprises the steps of coating a solution prepared by dissolving an organic material in a solvent to form a liquid layer, and subsequently removing the solvent by blowing air to form at least a layer, wherein the drying rate of the solvent relative to butyl acetate is from 1 to 1000, (in which the drying rate of butyl acetate is 100), the thickness of the formed liquid layer is from 1 μm to 100 μm, the rate of blowing the air is from 0.1 m/s to 5 m/s and the time elapsing between the completion of coating and the initiation of blowing is from 0 sec. to 60 sec.

The said at least a layer includes a hole transport layer, an emission layer, and an electron transport layer, of which the emission layer is specifically preferred.

As a result of detailed study by the inventors, it was proved that coating in the method of the present invention produced no coating unevenness, enabling preparation of a device of uniform emission and enhanced external quantum efficiency. The reason therefor is not clearly defined but it is presumed that the selection of an appropriate solvent and the optimization of drying conditions render it feasible to form a uniform amorphous layer with restricted crystallization.

Relative Drying Rate of Solvent:

The relative drying rate of a solvent used in the present invention is from 1 to 1000, based on the drying rate of butyl acetate being 100, and preferably from 100 to 700. A drying rate of more than 1000 is too fast to control drying and a drying rate of less than 1 is too slow, resulting in deteriorated external quantum efficiency. In the present invention, the drying rate is determined in such a manner that a liquid layer with a prescribed thickness is formed by applying a wire bar under an environment within a gloved box (moisture content of less than 1 μm) at 25° C. and a time until it is evaporated is measured. It is represented by a relative rate, based on the drying rate of butyl acetate being 100.

In cases when two or more solvents are used, a mixture thereof is coated by applying a wire bar in the foregoing manner to be measured.

Liquid Layer Thickness:

In the present invention, the thickness of a liquid layer prepared by a wet process is from 1 μm to 100 μm. A thickness of less than 1 μm is too thin to be controlled in drying and a thickness exceeding 100 μm takes a too long time to be dried, resulting in coating unevenness. The liquid layer thickness can be adjusted by controlling he liquid quantity.

Rate of Air-blowing:

In the step of removing a solvent by blowing air in the present invention, the air-blowing rate is from 0.1 m/s to 5 msec, preferably from 0.2 m/s to 2 msec, and more preferably from 0.2 m/s to 1 m/sec. An air-blowing rate of less than 0.1 m/s results in variation in the morphology of the coated layer, leading to a lowering of external quantum efficiency, while an air-blowing rate of more than 5 m/s results in unevenness in blowing rate, leading to deterioration in coating evenness. Herein, the air-blowing rate refers to a rate of blowing air onto the coated layer surface.

Time Between Completion of Blowing and Initiation of Coating (Timing of Blowing):

In the present invention, the time between completion of coating and initiation of blowing is from 0 to 60 sec., preferably from 1 to 10 sec., and more preferably from 1 to 5 sec. A time of more than 60 sec. results in dissolution of the lower layer, leading to deterioration in external quantum efficiency.

Boiling Point of Solvent:

Taking external quantum efficiency, solubility, drying property and the like into account, the boiling point of a solvent used in the present invention is preferably not less than 40° C. and less than 200° C., and more preferably not less than 40° C. and not more than 150° C.

Solvent Mixture:

It is preferred to use a mixture of two or more solvents. Taking external quantum efficiency, solubility, drying property and the like into account, it is preferred to mix a solvent exhibiting a relative drying rate of less than 50 and a solvent exhibiting a relative drying rate of not less than 200.

Blowing Temperature:

In the present invention, taking into account external quantum efficiency, drying property and the like, the temperature of blown air preferably is the same as or lower than the temperature of a coating environment, wherein the temperature of a coating environment is from 15 to 40° C.

Low Molecular Weight Compound:

An organic compound for use in the present invention preferably is a low molecular weight compound, taking external quantum efficiency and lifetime into account. A markedly enhanced external quantum efficiency has come into effect, when using a low molecular weight compound with a molecular weight of less than 1600. The low molecular weight compound refers to a compound having a molecular weight of 300 to 1600.

Formed Layer:

The thus formed layer preferably is a light-emitting layer. In the light-emitting layer, the external quantum efficiency can be markedly improved by controlling drying in the present invention.

Coating Method:

In the step of coating a solution, there is preferably employed a dip coating method, a spin coating method, a blade coating method or a slit coating method, which are suitable to form a uniform layer over a large area, and application of these coating methods makes it feasible to achieve a marked improvement in uneven coating.

Advantageous effects of the production method of an organic electroluminescence device according to the present invention include that the light-emitting layer contains mixed plural compounds, such as a dopant, a host compound and the like, and drying each of them can be controlled, rendering it feasible to achieve enhanced external quantum efficiency.

Hereinafter, there will be detailed the organic electroluminescence device of the present invention.

Layer Arrangement of Organic EL Device:

In the following, there are shown specific examples of the layer arrangement of the organic EL device related to the production method of the organic EL device of the present invention are shown below, but the present invention is not limited thereto:

(i) anode/light-emitting layer/electron transport layer/cathode, (ii) anode/hole transport layer/light-emitting layer/electron transport layer/cathode, (iii) anode/hole transport layer/light-emitting layer/hole blocking layer/electron transport layer/cathode, (iv) anode/hole transport layer/light-emitting layer/hole blocking layer/electron transport layer/cathode buffer layer/cathode, (v) anode/cathode buffer layer/hole transport layer/light-emitting layer/hole blocking layer/electron transport layer/cathode buffer layer/cathode.

Light-emitting Layer:

The light-emitting layer related to the present invention is a layer emitting light upon recombination of an electron and a hole injected from an electrode, or an electron transport layer or a hole transport layer, and the light-emitting portion may be within a light-emitting layer or at the interface between the light-emitting layer and an adjacent layer.

The thickness of a light-emitting layer is not specifically limited but is preferably controlled to be within a range of 2 nm to 200 nm, and more preferably 5 nm to 100 nm, taking into account the uniformity of the formed layer, prevention of application of an unnecessarily high voltage when emitting light and an enhancement of stability of emitted light color versus the electric driving current.

The light-emitting layer of the organic EL device of the present invention preferably contains a host compound and, as a guest compound, at least one light-emitting dopant, and more preferably, a host compound and at least three light-emitting dopants. In the following, there will be described a host compound and a light-emitting dopant contained in the light-emitting layer.

Host Compound:

There will be described a host compound usable in the present invention.

In the present invention, the host compound refers to a compound which accounts for at least 20% by mass of compounds contained in the light-emitting layer and exhibits less than 0.1 of the phosphorescence quantum efficiency at room temperature (25° C.) of less than 0.1, and preferably less than 0.01 of thea phosphorescence quantum efficiency. Preferably, it accounts for at least 20% by mass of compounds contained in the light-emitting layer.

Such a host compound may use commonly known host compounds, singly or in their combination. The use of plural host compounds makes it possible to control charge movement, which render it feasible to prepare an organic El device with enhanced external quantum efficiency. The use of plural kinds of light-emitting dopants enables a mix of different emissions, rendering it feasible to obtain any emitted light color.

A host compound usable in the present invention is preferably a low molecular weight compound known in the prior-art.

Specific examples of host compounds known in the prior-art are described in the following literatures:

JP 2001-257076A, 2002-308855A, 2001-313179A, 2002-319491A, 2001-357977A, 2002-334786A, 2002-8860A, 2002-334787A, 2002-15871A, 2002-334788A, 2002-43056A, 2002-334789A, 2002-75645A, 2002-338579A, 2002-105445A, 2002-343568A, 2002-141173A, 2002-352957A, 2002-203683A, 2002-363227A, 2002-231453A, 2003-003i65A, 2002-234888A, 2003-027048A, 2002-255934A, 2002-260861A, 2002-280183A, 2002-299060A 2002-302516A, 2002-305083A, 2002-305084A and 2002-308837.

Light-emitting Dopant:

In the following, there will be described a light-emitting dopant usable in the present invention.

A light-emitting dopant used in the present invention can employ fluorescence dopants and phosphorescence dopants, and, to obtain an organic EL device with a higher external quantum efficiency, it is preferable to contain, together with the foregoing host compound, a phosphorescent dopant as a light-emitting dopant for use in the light-emitting layer or light-emitting unit of the organic EL device of the invention.

Such a phosphorescent dopant can appropriately be selected from commonly known phosphorescent dopants used in organic EL devices.

A phosphorescent dopant related to the production method of an organic EL device of the present invention is preferably a complex compound containing a metal selected from elements of Groups 8 to 10 in the periodic table, and more preferably, an iridium compound, an osmium compound, platinum compound (platinum complex compound) or a rare earth complex, and still more preferably, an iridium compound. Further, a low molecular weight compound is also preferable as a phosphorescent dopant.

Specific examples of a compound usable as a phosphorescent dopant are shown below, but the present invention is not limited to these. These compounds can be synthesized by the method described in, for example, Inorg. Chem., 40, 1704-1711.

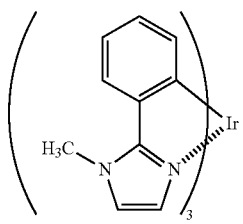

D-1

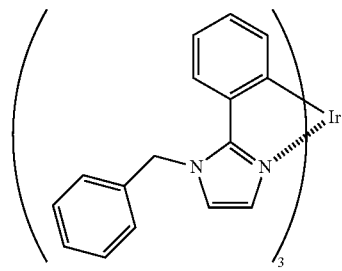

D-2

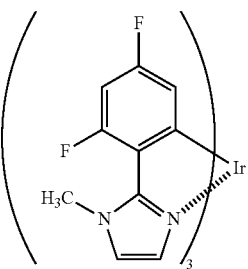

D-3

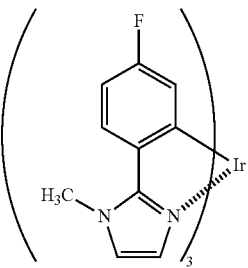

D-4

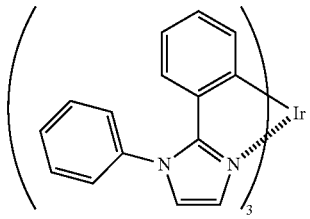

D-5

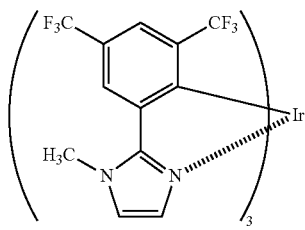

D-6

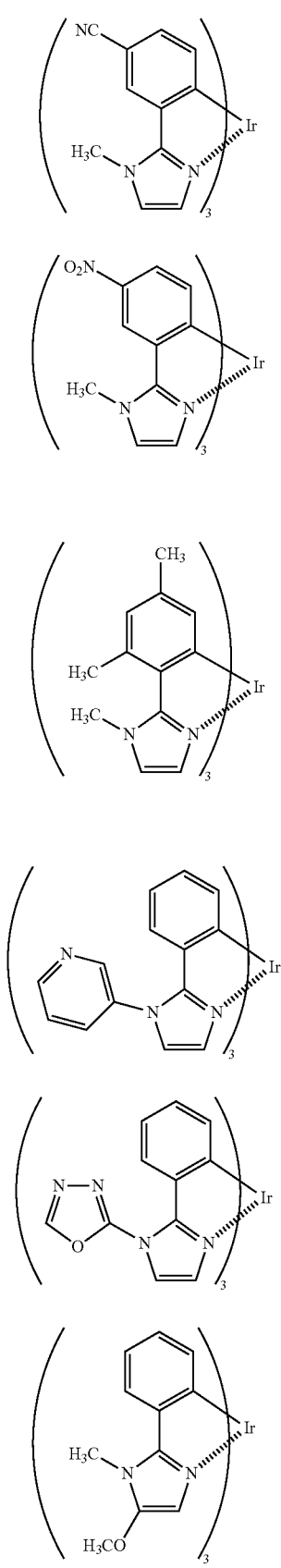
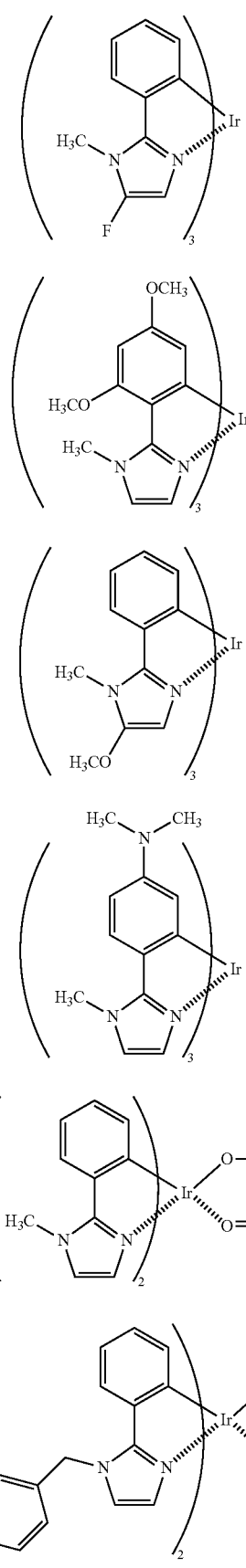

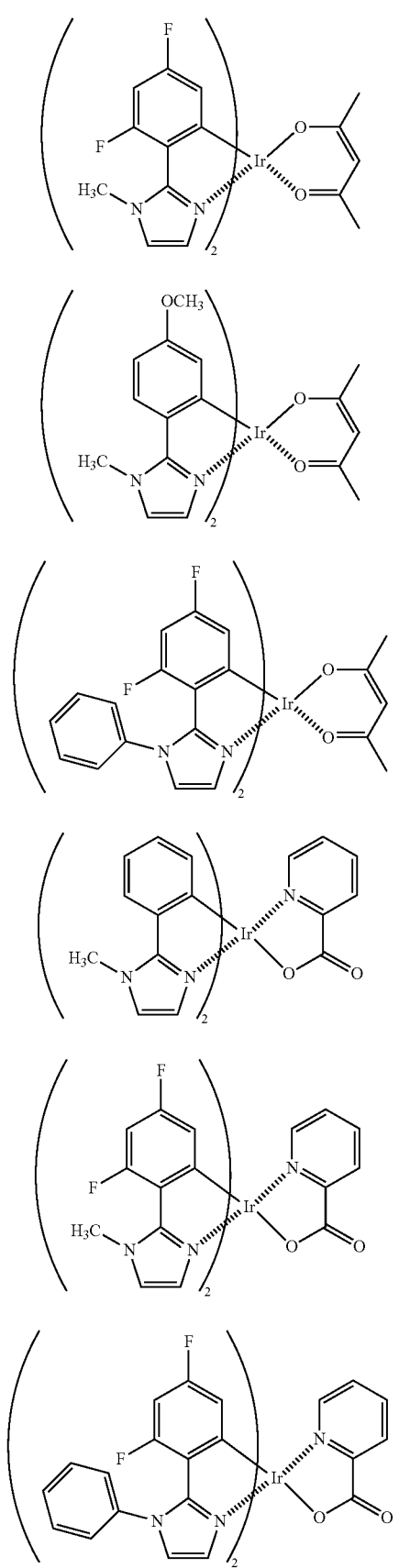

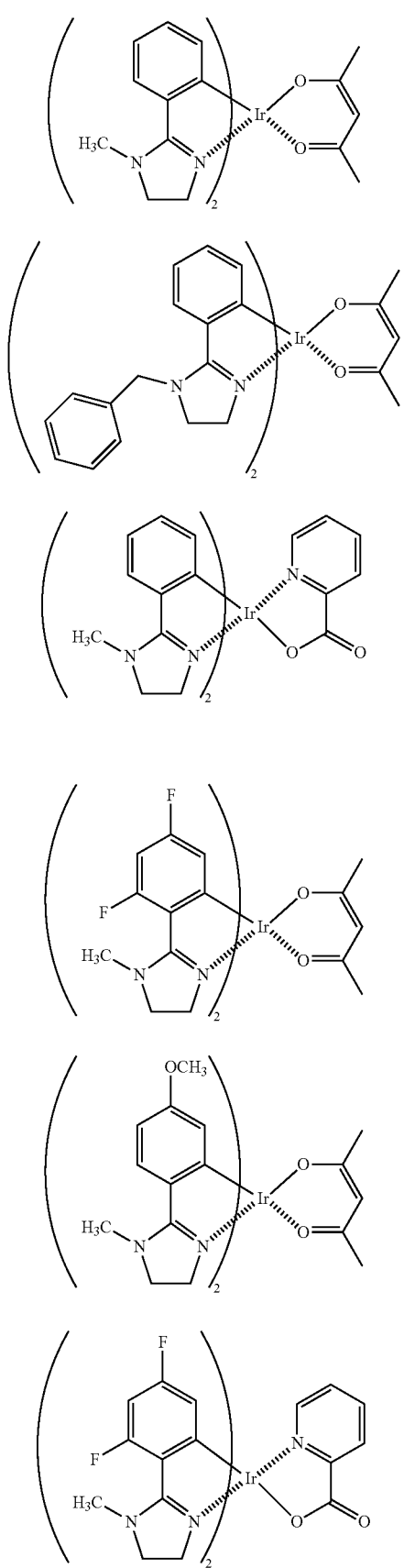

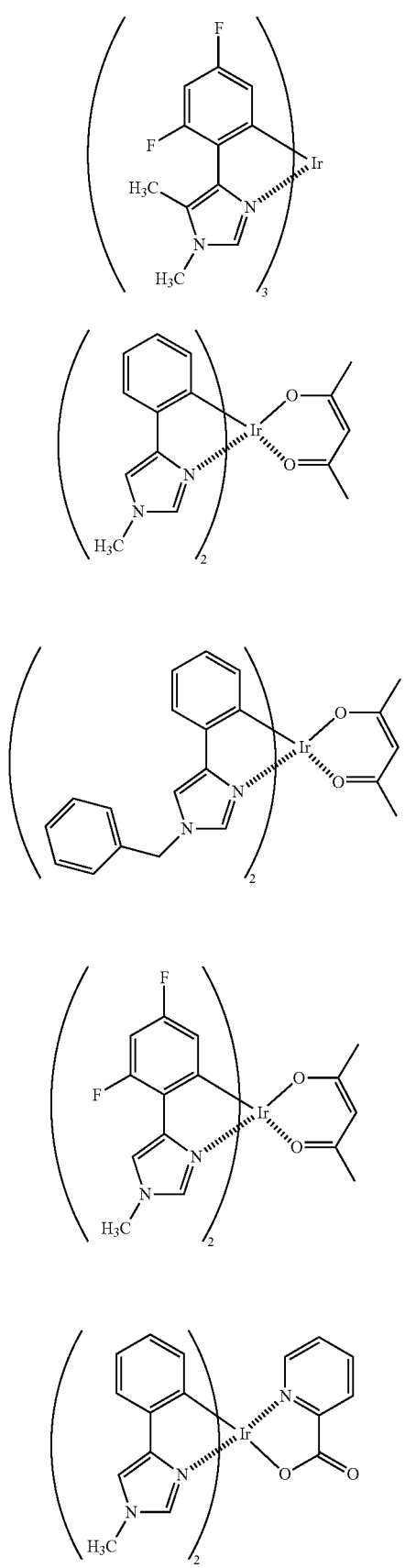
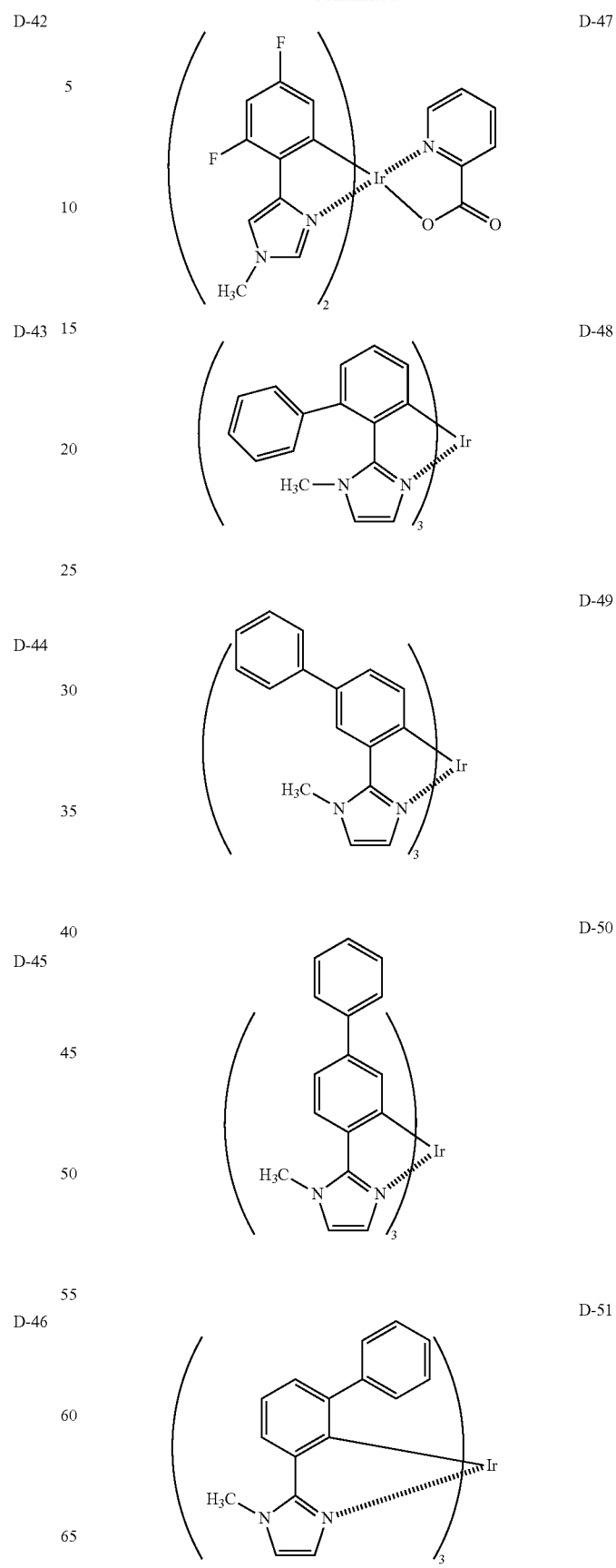

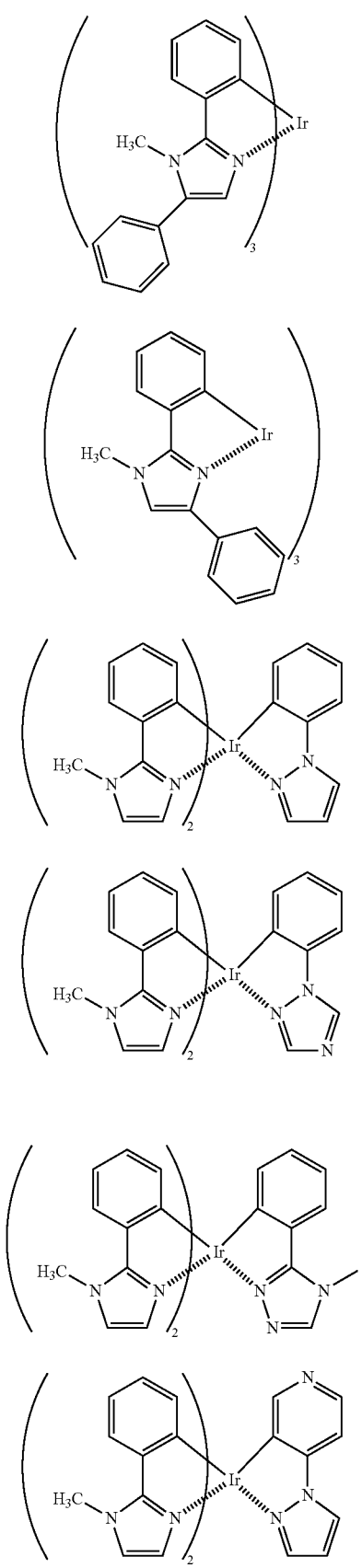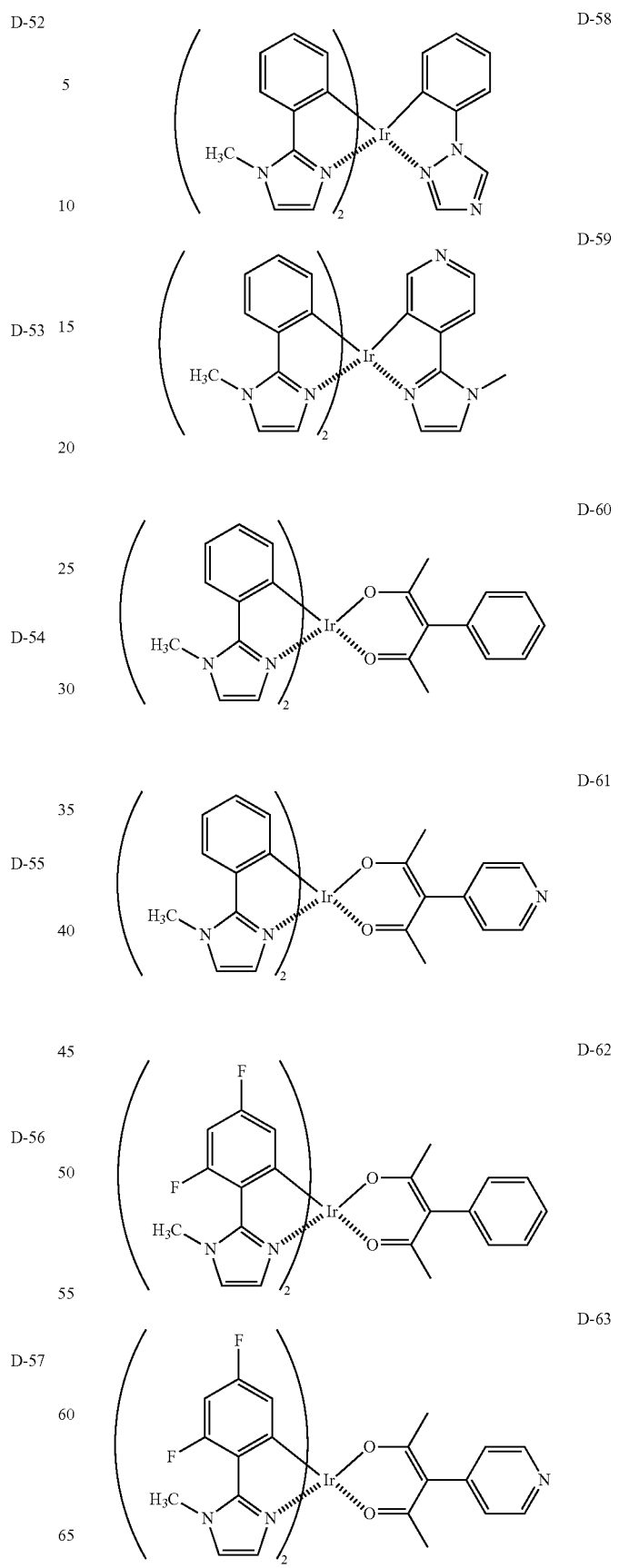

D-64
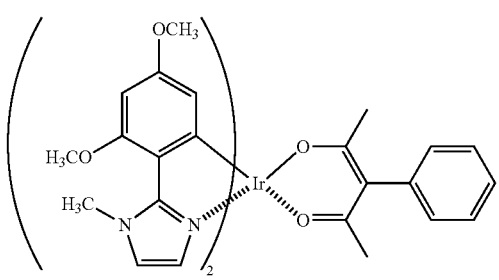
D-65
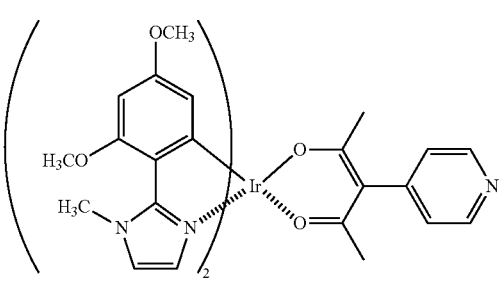
D-66
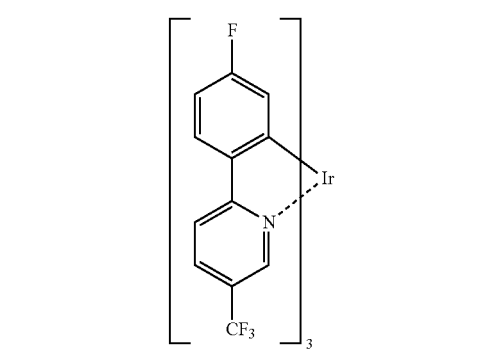
D-67
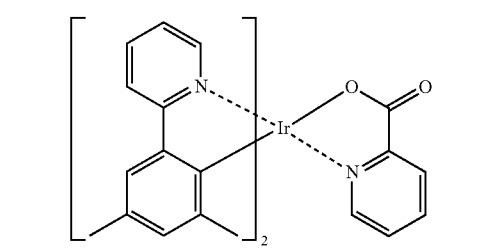
D-68
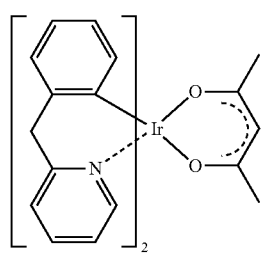
Ir-1
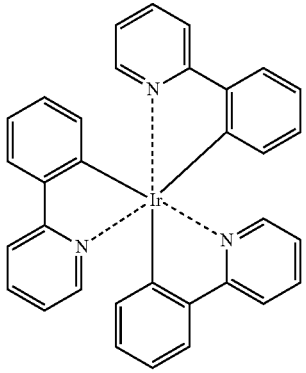
Ir-2
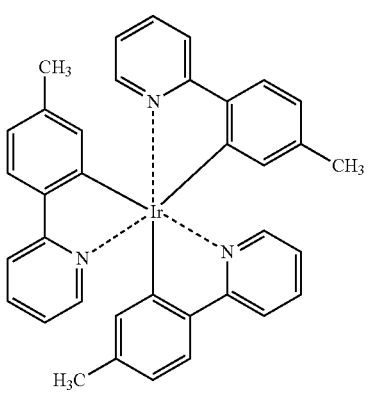
Ir-3
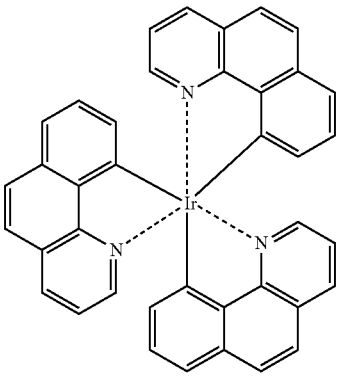
Ir-4
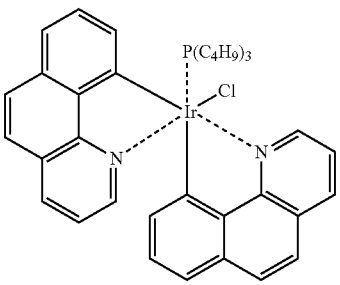

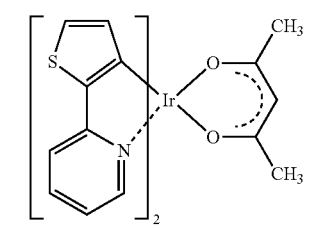
Ir-5
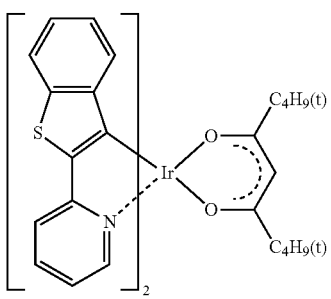
Ir-6
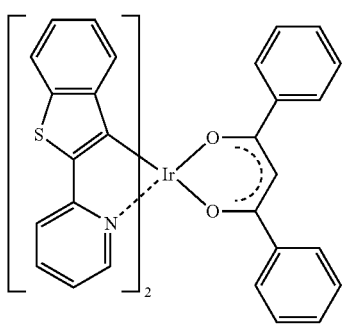
Ir-7
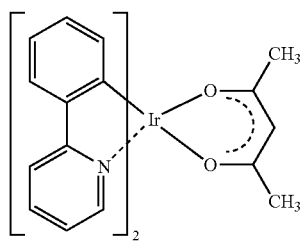
Ir-8
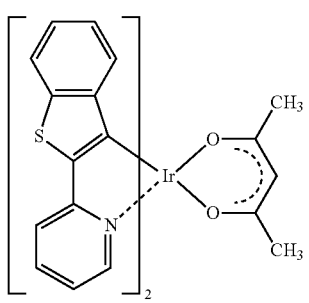
Ir-9
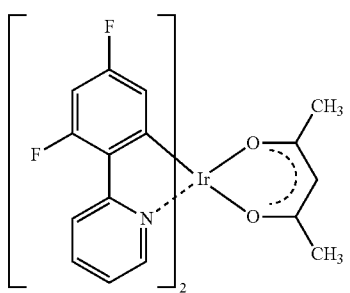
Ir-10
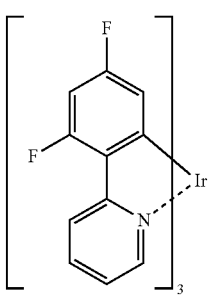
Ir-11
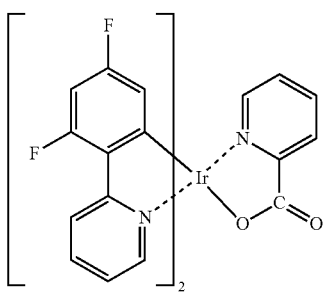
Ir-12
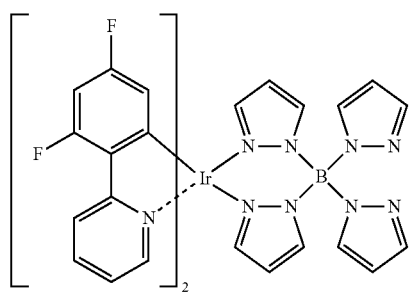
Ir-13
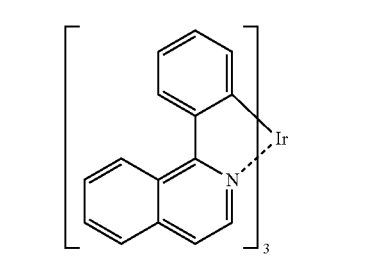
Ir-14

-continued
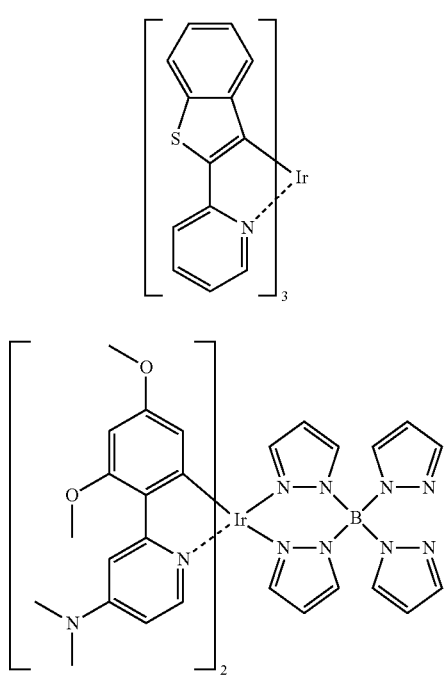
Ir-15
Ir-16
Pt-1
Pt-2
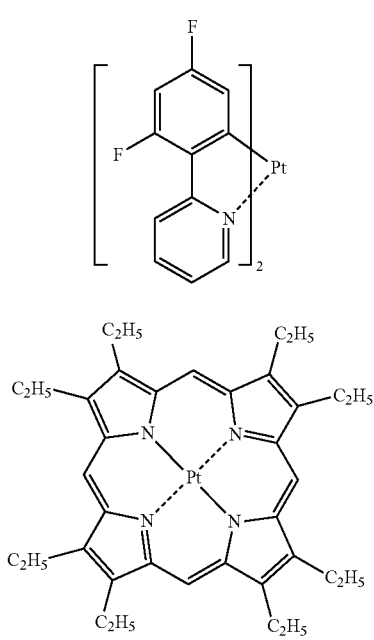
Pt-3
-continued
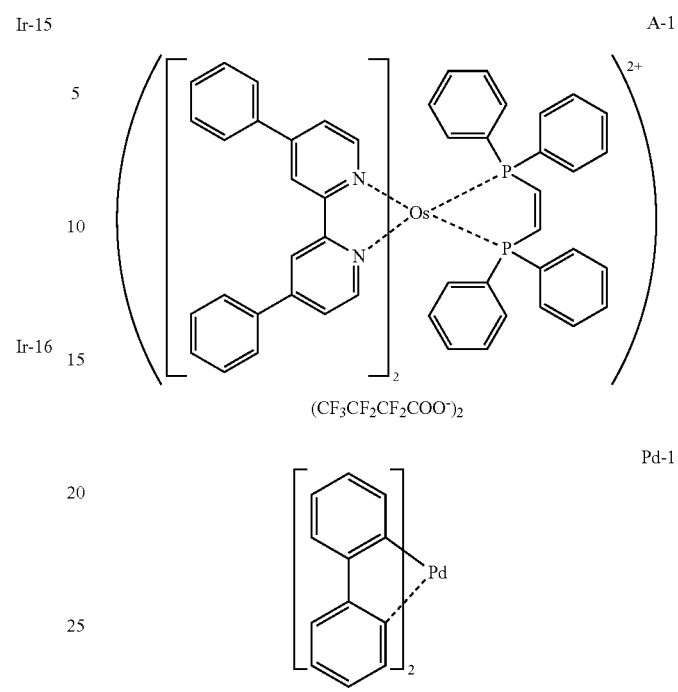
A-1
$(CF_3CF_2CF_2COO^-)_2$
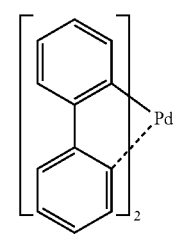
Pd-1
Pd-2
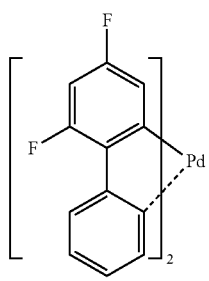
Pd-3
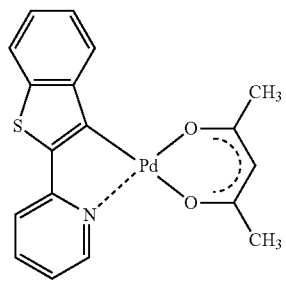
Rh-1

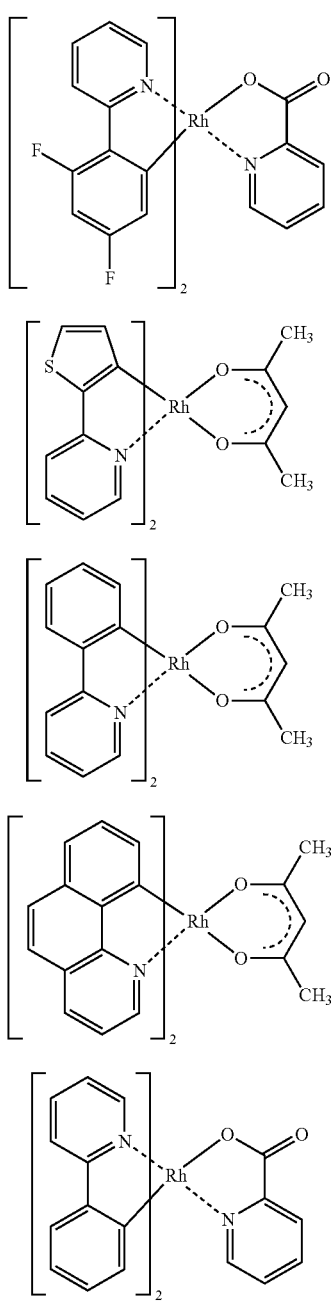

Next, there will be described an injection layer, a blocking layer, an electron transport layer and the like which are used as construction layers of the organic EL device of the present invention.

Injection Layer, Electron Injection Layer and Hole Injection Layer:

An injection layer, which is provided as needed and includes an electron injection layer and a positive hole injection (hereinafter, denoted as hole injection) layer, may be allowed to exist between an anode and a light-emitting layer or hole transport layer, and between a cathode and a light-emitting layer or electron transport layer.

The injection layer refers to a layer provided between an electrode and an organic layer for lowering the driving voltage or enhancement of emission luminance and includes a hole injection layer (or an anode buffer layer) and an electron injection layer (or a cathode buffer layer), which is detailed in "Yuki EL Soshi to Sono Kogyoka-saizensen" (Organic EL Device and Front Line of Its Industrialization), 2nd edition (published by NTS Co., 1998 November), Second Chapter, "Denkyoku Zairyou" (Electrode Material), pages 123-166.

An anode buffer layer (or hole injection layer) is described in detail in JP 9-045479A, 9-260062A, and 8-288069A. Specific examples thereof include a phthalocyanine buffer layer, as typified by copper phthalocyanine, an oxide buffer layer, as typified by vanadium oxide, an amorphous carbon buffer layer and a high molecular buffer layer employing an electrically conductive polymer such as polyaniline (emeraldine) or polythiophene.

There are also cited, as a hole injection layer, a ferrocene compound described in JP 6-025658A, a starburst type compound described in JP 10-233287A, a triarylamine type compound described in JP 2000-068058A and JP 2004-006321 A, a sulfur-containing-cycle containing compound described in JP 2002-117979A, and a hexanzatriphenylene compound described in US Patent 2002/015824A, US Patent 2006/0251922A and JP 2006-049393A.

The production method of an organic El device of the present invention is applicable to any organic layer of an organic EL device, preferably to a layer adjacent to an electrode, and more preferably to an anode buffer layer (also called a hole injection layer or a hole injection transport layer).

A cathode buffer layer (or electron injection layer) is described in detail in JP 6-325871A, 9-017574A and 10-074586A, and specific examples thereof include a metal buffer layer, such as strontium or aluminum; an alkali metal compound buffer layer, such as lithium fluoride; an alkaline earth metal compound buffer layer, such as magnesium fluoride; and an oxide buffer layer, such as aluminum oxide. The foregoing buffer layers (or injection layers) preferably are an extremely thin layer and their thickness, depending of the raw material, is preferably from 0.1 nm to 5 μm.

Blocking Layer, Hole Blocking Layer and Electron Blocking Layer:

In addition to the foregoing thin organic compound layers, as basic construction layers, there is provided a blocking layer, as needed. Examples thereof include a hole blocking layer, as described in "Yuki EL Soshi to Sono Kogyoka-saizensen" 2nd edition (published by NTS Co., 1998 November), page 237.

Such a hole blocking layer, which functions as an electron transport layer in a broad sense and is comprised of a hole block material which is markedly small in capability of transporting a hole with having an electron transporting capability, can achieve an enhancement of recombination probability of an electron and a hole by blocking holes, while transporting electrons. Further, it is possible to use, as required, the construction of an electron transport layer described later as a hole blocking layer related to the organic El device production method of the present invention.

The hole blocking layer of the organic EL device of the present invention is provided preferably adjacent to a light-emitting layer.

The hole blocking layer preferably contains azacarbazole derivatives cited as the foregoing host compound.

Further, a hole blocking layer preferably exhibits an ionization potential of not less than 0.3 eV for a host compound of a light-emitting layer. In cases when comprised of plural light-emitting layers, a hole blocking layer preferably exhibits an ionization potential of not less than 0.3 eV for the host compound closest to the cathode.

The ionization potential is defined as the energy necessary to liberate an electron located on the HOMO (highest occupied molecular orbital) level to a vacuum level and can be determined in the manner, for example, as described below.

(1) Using software for molecular orbital calculation, Gaussian 98 (Gaussian 98, Revision A. 11.4, M. J. Frisch et al, Gaussian, Inc., Pittsburgh Pa. 2002), a value (represented by equivalent converted to eV unit) which is calculated through optimization, using B3LYP/6-31G* as a keyword, is rounded to two decimals to determine an ionization potential. The background for this calculated value being effective, resides in high correlation between the value determined by this technique and an experimental value.

(2) The ionization potential can also be determined directly through measurement by photoelectron spectroscopy. There can be appropriately used, for example, a low energy electron spectrometer, Model AC-1, produced by Riken Keiki Co., Ltd. or a method known as ultraviolet photoelectron spectrometry.

On the other hand, an electron blocking layer, which has the function of a hole transport layer in a broad sense and is comprised of an electron block material which has a hole transport capability but is markedly low in capability of transporting an electron, can achieve enhancement of recombination probability of an electron and a hole by blocking holes, while transporting holes. Further, it is possible to use, as required, the construction of a hole transport layer described later as an electron blocking layer relating to the organic El device production method of the present invention. The thickness of a hole blocking layer or an electron transport layer is preferably from 3 nm to 100 nm, and more preferably from 5 nm to 30 nm.

Hole Transport Layer:

A hole transport layer is comprised of a hole transport material having the function of transporting a hole, and including, in a broad sense, a hole injection layer, an electron blocking layer and a hole transport layer. The hole transport layer may be provided with a single layer or plural layers.

A hole transport material, which exhibits injection or transport of a hole or a barrier to an electron, may be any one of an organic material and an inorganic material. Examples thereof include triazole derivatives, oxadiazole derivatives, imidazole derivatives, polyarylalkane derivatives, pyrazoline derivatives and pyrazoline derivatives, phenylenediamine derivatives, arylamine derivatives, amino-substituted chalcone derivatives, oxazole derivatives, strylanthracene derivatives, fluorene derivatives, hydrazone derivatives, stilbene derivatives, and silazane derivatives.

As a hole transport material can be employed above-described materials, but a porphyrin compound, an aromatic tertiary amine compound and a styrylamine compound are preferably used, and an aromatic tertiary amine compound is specifically preferred.

Typical examples of an tertiary aromatic tertiary amine include N,N,N',N'-tetraphenyl-4,4'-diaminophenyl; N,N'-diphenyl-N,N''-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis-(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quadriphenyl; N,N,N-trip-tolyl)amine, 4-(di-p-tolylamino)-4'-[4-(di-p-tolylamino)styryl]stilbene; 4-N,N-diphenylamino-(2-diphenylvinyl)benzene, 3-methoxy-4'-N, N-diphenylaminostirylbenzene; and N-phenylcarbazole. Further, there are also cited a compound containing two condensed aromatic rings in the molecule, as described in U.S. Pat. No. 5,061,569, for example, 4,$'-bis[N-(1-naphthyl)-N-phenylamino]biphenyl (NPD); and a compound in which three triphenylamine units are connected in a starburst form, as described in JP 4-308688A, for example, 4,4',4''-tris[N-(3-methylphenyl)-N-phenylamino]triphenylamin (MTDATA).

There is also usable a so-called p-type hole transport material, as described in JP 11-251067A and Huang et al., Applied Physics Letters 80 (2002) p. 139. In the present invention, it is preferable to use these materials to produce a light-emitting device with enhanced external quantum efficiency.

The hole transport layer can be prepared by making a thin film with the foregoing hole transport material by a commonly known method, such as a vacuum vapor deposition method, a spin-coating method, a casting method or the like. The thickness of a hole transport layer is not specifically limited, but is usually from 5 nm to 5 μm, and preferably from 5 nm to 200 nm. The hole transport layer may be a single layer structure formed of one or more of the materials described above.

Further, there is also usable a hole transport layer which is impurity-doped and exhibits a high p-characteristic. Examples thereof include those described in JP 4-297076A, 2000-196140A, and 2001-102175, and J. Appl. Phys., 95, 5773 (2004).

In the present invention, it is preferred to use a hole transport layer of such a high p-characteristic, whereby a device of reduced power consumption can be prepared.

Electron Transport Layer:

An electron transport layer is comprised of a material exhibiting a function of transporting an electron and, in a broad sense, an electron injection layer and a hole blocking layer are included in the electron transport layer. An electron transport layer may be provided of a single layer or plural layers.

An electron transport material (which doubles as a hole blocking material), which is conventionally a single layer but, in a case of plural layers, is adjacent to the cathode side of a light-emitting layer, and has a function of transporting electrons injected from the cathode to the light-emitting layer. Such a material can be chosen from commonly known compounds and examples thereof include nitro-substituted fluorene derivatives, diphenylquinone derivatives, thiopyrane dioxide derivatives, a carbodiimide, fluorenylidenemethane derivatives, anthraquinone and anthrone derivatives, and oxadiazole derivatives.

In the foregoing oxadiazole derivatives, a thiadiazole derivative in which the oxygen atom of an oxadiazole ring is replaced by a sulfur atom and a quinoxaline derivative containing a quinoxaline ring are also known as an electron transport material.

There are also usable, as an electron transport material, metal complexes of quinolinol derivatives, for example, tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc, and metal complexes in which the central metal of the foregoing metal complex is replaced by In, Mg, Cu, Ca, Sn, Ga or Pb.

Further, a metal phthalocyanine or its metal-free one, and one whose end group is substituted by an alkyl group or a sulfonic acid group are preferably used as an electron transport material. Further, distyrylpirazine derivatives, exemplified as a material for a light-emitting layer, are also usable as an electron transport material, and, similarly to a hole injection layer and a hole transport layer, an inorganic semiconductor such as a n-type Si and n-type SiC are also usable as an electron transport material.

The electron transport layer can be prepared by forming a thin layer by a commonly known method such as a vacuum vapor deposition method, a spin coating method or a casting method or the like. The thickness of an electron transport layer is not specifically limited, but is usually from 5 nm to 5 µm, and preferably from 5 nm to 200 nm. The electron transport layer may be a single layer structure formed of one or more of the materials described above.

Further, there is also usable an electron transport layer which is impurity-doped and exhibits a high n-characteristic. Examples thereof include those described in JP 4-297076A, 10270172, 2000-196140A, and 2001-102175, and J. Appl. Phys., 95, 5773 (2004).

In the present invention, it is preferred to use an electron transport layer of such a high n-characteristic, whereby a device of reduced power consumption can be prepared.

Anode:

The anode of an organic EL device preferably employs, as an electrode material, a metal, an alloy and an electrically conductive compound which exhibit a large work function (not less than 4 eV), and a mixture of them. Specific examples of such an electrode material include metals such as Au and electrically conductive transparent materials such as CuI, indium tin oxide (ITO), $SnO_2$, and ZnO. There may also be used amorphous materials capable of forming a transparent electric-conductive layer, such as IDIXO ($In_2O_3$—ZnO).

An anode may be prepared by forming a thin layer with the foregoing electrode material through vapor deposition, sputtering or the like, followed by formation of a pattern of an intended form. Alternatively, in cases of not requiring a high pattern precision (at a level of 100 µm or more), a pattern may be formed through a mask of the intended form, while allowing the foregoing electrode material to be vapor-deposited or sputtered. Further, in cases when using a material such as an organic conductive material which can be coated, a wet film-forming method, such as a printing method or coating method, is also applicable. When extracting emission from the anode, it is preferred to adjust a transmittance to 10% or more and the sheet resistance as an anode is preferably not more than some hundreds $\Omega/\square$. The thickness, depending on material, is usually from 10 nm to 1000 nm, and preferably from 10 nm to 200 nm.

Cathode:

The cathode employs, as an electrode material, a metal, an alloy or an electrically conductive compound which exhibit a small work function (not more than 4 eV), and a mixture of them. Specific examples of such an electrode material include sodium, sodium-potassium alloy, magnesium, lithium, magnesium/copper mixture, magnesium silver mixture, magnesium aluminum mixture, magnesium/indium mixture, aluminum/aluminum oxide ($Al_2O_3$) mixture, indium, lithium/aluminum mixture and rare earth metals.

Of these, a mixture of a metal capable of electron injection and a second metal as a stable metal of a further larger work function and enhanced stability is suitable in terms of electron injection property and durability against oxidation or the like, and preferred examples thereof include a magnesium/silver mixture, a magnesium/aluminum mixture, a magnesium/indium mixture, an aluminum/aluminum oxide ($Al_2O_3$) mixture, and a lithium/aluminum mixture. A cathode can be prepared by forming a thin layer with the foregoing electrode materials through vapor deposition, sputtering, or the like.

The sheet resistance as a cathode is preferably not more than some hundreds $\Omega/\square$ and the thickness is usually from 10 nm to 5 µm, and preferably from 50 nm to 200 nm. To transmit emitted light, either an anode or a cathode of an organic El device is preferably transparent or semi-transparent to achieve enhanced emission luminance.

After forming a cathode with a 1-20 nm thick metal, a transparent electric-conductive material is placed thereon, whereby a transparent or semi-transparent cathode can be prepared. Applying this, there can be prepared a device with light transmissive anode and cathode.

Substrate:

A substrate used for the organic EL device of the present invention is not specifically restricted with respect to its kind including glass, plastics and the like and may be transparent or opaque. In cases when extracting light from the substrate side, the substrate is preferably transparent. Preferred examples of a transparent substrate include glass, quartz and transparent resin film. A specifically preferred substrate is resin film which is capable of providing flexibility to an organic EL device.

Examples of such resin film include a polyester such as polyethylene terephthalate (PET) or polyethylene naphthalate (PEN), polyethylene, polypropylene; a cellulose ester or its derivative including cellophane, cellulose diacetate, cellulose triacetate, cellulose acetate butyrate, cellulose acetate propionate (CAP), cellulose acetate phthalate and cellulose nitrate; polyvinylidene chloride, polyvinyl alcohol, polyethylene vinyl alcohol, syndiotactic polystyrene, polycarbonate, norbomene resin, polymethyl pentene, polyether ketone, polyimide, polyether sulphone (PES), polyphenylene sulfide, polysulfones, polyether imide, polyether ketone imide, polyimide, fluororesin, nylon, polymethyl methacrylate, acryl or polyacrylate, and a cycloolefin resin such as ARTON (produced by JSR) or APEL (produced by Mitsui Kagaku Co., Ltd.).

There may be formed, on the resin film surface, an inorganic material or organic material film, or a hybrid film of both materials, and a barrier film exhibiting a moisture permeability (25±0.5° C., 90±2% RH) of not more than $1\times10^{-3}$ g/(m²/24 h) is preferred, and a high-barrier film exhibiting an oxygen permeability of not more than $1\times10^{-3}$ ml/m²/24 h·Pa and a moisture permeability (25±0.5° C., 90±2% RH) of not more than $1\times10^{-5}$ g/(m²/24 h) is more preferred.

A material to form a barrier film may be one which functions to inhibit permeation of moisture, oxygen or the like which results in deterioration, and, for example, silicon oxide, silicon dioxide, silicon nitride, or the like is usable. Further, to improve fragility of the film, it is preferred to form a layered structure comprised of such an inorganic layer and an organic layer comprised of an organic material. The laminating order of the inorganic layer and the organic layer is not specifically limited and it is preferred to laminate both layers alternately and plural times.

A method of forming a barrier layer is not specifically limited and specific examples thereof include a vacuum deposition method, a sputtering method, a reactive sputtering method, a molecular beam epitaxy, a cluster ion beam method, an ion plating method, a plasma polymerization method, an atmospheric plasma polymerization method, a plasma CVD method, a Laser CVD method, a thermal CVD method, and a coating method. Of these, the above atmospheric plasma polymerization method is specifically preferred.

Examples of an opaque substrate include a metal plate such aluminum or stainless steel, film or an opaque resin substrate, and a ceramic substrate.

In emission of the organic EL device of the present invention, the external quantum efficiency at room temperature is preferably not less than 1%, and more preferably not less than 5%.

The external quantum efficiency is defined below:

External quantum efficiency (%)=[(number of photons externally emitted from organic EL device)/ (number of electrons flown through organic EL device)]×100

There may be concurrently used a color improving filter or there may also be used a color conversion filter to convert emission color from an organic EL device to multi-colors by using a phosphor. When using a color conversion filter, the emission of an organic EL device preferably exhibits a λmax of 480 nm or more.

Sealing:

Examples of a means to seal the organic EL device used in the present invention include sticking a sealing member to the electrode or the substrate with an adhesive.

A sealing member, which is disposed so as to cover the display area of an organic EL device, may be in an intaglio plate form or a planar plate form. Any distinction is not considered with respect to transparency and electrical insulation.

Specific examples include a glass plate, a polymer plate or film, and a metal plate or film. Glass plates include, for example, soda-lime glass, barium•stronthium containing glass, lead glass, aluminosilicate glass, borosilicate glass, barium borosilicate glass and quartz. Polymer plates include, for example, polycarbonate, polyethylene terephthalate, polyether sulfide, and polysulfone. Metal plates include ones formed of at least a metal or an alloy selected from stainless steel, iron, copper, aluminum, magnesium, nickel, zinc, chromium, titanium, molybdenum silicon, germanium and tantalum.

In the present invention, the organic EL device can be prepared in a thin-film form, so that a polymer film or a metal film is preferably used as a sealing member. A polymer film preferably exhibits an oxygen permeability of not more than $1 \times 10^{-3}$ ml/m$^2$/24 h·atm and a moisture permeability (25±0.5° C., 90±2% RH) of not more than $1 \times 10^{-3}$ g/m$^2$/24 h), which are measured in accordance with JIS K 71269-1987 and JIS K 7129-1992, respectively.

There is employed a sandblasting treatment or a chemical-etching treatment to form the rugged surface of a sealing member.

Specific examples of an adhesive include photo-curable or heat-curable adhesives containing a reactive vinyl group of an acrylic oligomer or a methacrylic oligomer and a moisture-curable adhesive such as 2-cyanoacrylic acid ester. There is also cited an thermally and chemically curable epoxy-type (a two-liquid mix). There are also cited hot-melt type polyamide, polyester and polyolefin. Further, there is cited an ultra-violet-curable epoxy resin adhesive of a cationic-curable type.

An organic EL device may be deteriorated by a heat treatment, so that an adhesive which is curable at a temperature of room temperature to 80° C. is preferred. A desiccating agent may be dispersed in the foregoing adhesive. Coating an adhesive onto the sealed portion may be conducted by a commercially available dispenser or by printing, such as screen printing.

It is also preferable that, on the outside of an electrode of the side opposed to the substrate with sandwiching the organic layer, a layer of an inorganic material or organic material is formed, as a sealing layer, in the form of covering the electrode and the organic layer and being in contact with a substrate. In that case, a material forming such a layer may be any one having a function inhibiting permeation of a substance capable of inducing deterioration, such as moisture or oxygen, and, for example, silicon oxide, silicon dioxide, silicon nitride, or the like is usable. Further, to improve brittleness of such a layer, it is preferred to form a layered structure comprised of such an inorganic layer and a layer comprised of an organic material. The method of forming these layers is not specifically limited and examples thereof include a vacuum deposition method, a sputtering method, a reactive sputtering method, a molecular beam epitaxy method, a cluster ion beam method, an ion plating method, a plasma polymerization method, an atmospheric plasma polymerization method, a plasma CVD method, a laser CVD method, a thermal CVD method, and a coating method.

It is also preferred to inject an inert gas such as nitrogen or argon or an inert liquid such as fluorinated hydrocarbon or silicone oil into the space between the sealing member and the display area of an organic EL device. Evacuation is also feasible. It is also possible to enclose a moisture absorbing compound.

Examples of such a moisture absorbing compound include a metal oxide (for example, sodium oxide, potassium oxide, calcium oxide, barium oxide, magnesium oxide, aluminum oxide, etc.), a sulfate (for example, sodium sulfate, calcium sulfate, magnesium sulfate, cobalt sulfate, etc.), a metal halide (for example, calcium chloride, magnesium chloride, cesium fluoride, tantalum fluoride, cerium bromide, magnesium bromide, barium iodide, magnesium iodide, etc.) and a perchlorate (for example, barium perchlorate, magnesium perchlorate, etc.). The foregoing sulfate, metal halide and perchlorate preferably is preferably used in an anhydride form.

Preparation Method of Organic EL Device:

The method of preparing an organic EL device of the present invention is characterized in that a part or all of an organic layer sandwiched between an anode and a cathode is formed by a wet process. In the present invention, the wet process is to supply layer-forming materials in the form of a solution to form a layer.

In the following, there will be described, as an example of preparation method of the organic EL device of the present invention, a preparation method of an organic EL device comprised of anode/hole injection layer/hole transport layer/light-emitting layer/electron transport layer/electron injection layer/cathode.

First, a thin layer comprised of the intended electrode material, for example, an anode material, is formed on an appropriate substrate by a process of vapor deposition or sputtering so as to fall within a thickness of not more than 1 μm, and preferably within a range of 10 nm to 200 nm to prepare an anode.

Further thereon are formed, as organic El device materials, a hole injection layer, a hole transport layer, a light-emitting layer, an electron transport layer, an electron injection layer and a hole inhibition layer of an organic compound thin-layer (organic layer).

Methods of forming these layers include a vapor deposition method and a wet method (a coating method by using a so-called die, such as a spin coating method, a casting method and an extrusion method). In the present invention, layer formation by a coating method of a spin coating method or an extrusion method is preferred in which pin-holes are rarely formed.

Solvents to dissolve organic EL materials related to the organic EL device production method of the present invention are organic solvents, including nitriles such as acetonitrile and propionitrile; alcohols such as methanol, ethanol and butanol; ketones (carbonyls) such as acetone, methyl ethyl ketone and cyclohexane; fatty acid esters such as ethyl acetate; halogenated hydrocarbons such as dichlorobenzene; amides such as DMF; sulfoxides such as DMS; and nitromethane.

After forming these layers, further thereon, a thin layer comprised of a substance used for a cathode is formed by a method such as vapor deposition or sputtering so that the layer thickness falls within the range of not more than 1 μm, preferably 50 to 200 nm, whereby a cathode is provided to obtain then intended organic El device.

It is feasible to perform production sequentially in the reverse order of a cathode, an electron injection layer, an electron transport layer, a light-emitting layer, a hole injection layer and a cathode. In cases when applying a direct current to the thus obtained multicolor display, a voltage of the level of 2 to 40 V is applied to observe emission, while the polarity of the anode is made positive and that of the cathode is made negative.

Protective Layer and Protective Plate:

To enhance the mechanical strength of the device, a protective layer or a protective plate may be provided on the outside of the foregoing sealing layer or sealing plate on the side opposed to the substrate by interposing an organic layer. Specifically when sealing is performed by the foregoing sealing layer, its mechanical strength may not be necessarily high; it is preferred to provide such a protective layer or a protective plate. A material usable for this may employ a polymeric plate or film, or a metallic plate or film similar to the above-described sealing, and a polymeric film is preferred in terms of light weight and thin-film formation.

Light Extraction:

It is generally thought that an organic El device emits light within a layer exhibiting a higher refractive index (within a refractive index of 1.7 to 2.1) than air and only 15 to 20% of light emitted in the emission layer can be extracted. This is ascribed to the fact that light which is incident upon the interface (the interface between a transparent substrate and air) at an angle (θ) higher than a critical angle causes total reflection and cannot be externally extracted, or the incident light causes total reflection between a transparent electrode or a light-emitting layer and a transparent substrate and is guided through the transparent electrode or a light-emitting layer and as a result, the light is permitted to escape to the side direction of the device.

Examples of a technique of achieving enhanced light extraction efficiency include a technique of forming irregularities on the surface of a transparent substrate to inhibit total reflection between the transparent substrate and air (as described in the specification of U.S. Pat. No. 4,774,435), a technique of providing a light-collecting property to the substrate (as described in JP 63-314795A), a technique of forming a reflection surface on the side surface of an organic EL device (as described in JP 01-220394), a technique of introducing a planar layer exhibiting an intermediate refractive index between the substrate and a light-emitting material to form an anti-reflection layer (as described in JP 62-172691A), a technique of introducing a planar layer exhibiting a lower refractive index than the substrate between the substrate and a light-emitting material (as described in JP 2001-02827A), and a technique of forming a refraction grating between any two of the substrate, a transparent electrode layer and a light-emitting layer, including "between the substrate and an external atmosphere" (as described in JP 11-283751A).

In the present invention, these techniques of achieving enhanced light extraction efficiency may be combined with the organic El device of the present invention, but it is preferred to employ a technique of introducing a planar layer exhibiting an intermediate refractive index between the substrate and a light-emitting material or a technique of forming a refraction grating between any two of the substrate, a transparent electrode layer and a light-emitting layer, including "between the substrate and the external atmosphere".

In the present invention, the combination of these techniques can obtain an organic EL device with further enhanced luminance or superior durability.

When forming a medium of a low refractive index at a length longer than the wavelength of light between a transparent electrode and a transparent substrate, light emitted from the transparent electrode results in a higher external extraction efficiency in a medium of a lower refractive index.

Examples of such a layer with a low refractive index include aero-gel, porous silica, magnesium fluoride, and a fluorinated polymer. The refractive index of a transparent substrate is generally in the range of 1.5 to 1.7, so that that of a low refractive index layer is preferably not more than 1.35.

Further, the thickness of a medium of a low refractive index is desirably at least two times greater than the wavelength within the medium. This is ascribed to the fact that, when a medium of a low refractive index decreases in thickness to a light wavelength level and reaches a thickness at which an electromagnetic wave having seeped through evanescent enters the substrate, the effect of the layer of a low refractive index is weakened.

A method of introducing a diffraction grating to the interface causing total reflection, or into either medium, is featured in that enhanced light extraction efficiency is achieved. In this method, employing such a property that diffraction plating can alter the direction of light to a specific direction differing from refraction through so-called Bragg refraction such as primary refraction or secondary refraction of lights generated in a light-emitting layer, light which cannot exit through total reflection between layers or the like is diffracted by introducing a diffraction grating to extract the light.

The thus introduced diffraction grating desirably exhibits a two-dimensional cyclic refractive index. Light emitted in the emission layer is randomly produced in all directions but a general one-dimensional diffraction grating, which has a periodic refractive index distribution only in a specific direction, allows only light which proceeds in a specific direction to be diffracted, resulting in low light extraction efficiency. However, when a periodic refractive index distribution becomes two-dimensional one, light proceeding in all directions is refracted, resulting in enhanced light extraction efficiency.

A diffraction grating may be introduced at the position between any layers or within a medium (for example, within a transparent substrate or between transparent electrodes), but is preferably in the vicinity of an organic light-emitting layer. In that case, the period of the diffraction grating is preferably from ½ to 3 times the wavelength of the light within a medium.

The arrangement of a diffraction grating is preferably repeated two-dimensionally, example, in a square lattice form, triangular lattice form or a honeycomb lattice form.

Light Condensing Sheet:

The organic EL device of the present invention may be provided with a structure of a microlens array form or combined with a so-called light-condensing sheet on the light-extracting side of the substrate, whereby light is condensed in a specific direction, for example, in the front direction of the light-emitting face, resulting in increased luminance in a specific direction.

As an example of a microlens array, quadrangular pyramids with a 30 μm side and a 90° apex angle are two-dimensionally arranged. A side length of 10 to 100 μm is preferred. A lesser length than this causes a diffraction effect, resulting in coloring, while an excessive length results in an increased thickness, which is undesirable.

There is usable a light condensing sheet which is practically used in an LED backlight of a liquid crystal display. Examples of such a sheet include a brightness enhancement film (BEF), made by Sumitomo 3M Co., Ltd. Examples of the form of a prism sheet include a form of triangular stripes of a 90° apex angle and a 50 μm pitch, formed on the substrate, a form of a rounded apex angle, a form of random-varied pitch, and other forms.

There may be used a light diffusing plate or film in combination with a light condensing sheet to control the light emitting angle from a light-emitting device. There may used, for example, a light diffusing film (LIGHT UP) made by Kimoto Co., Ltd.

Uses:

The organic EL device of the present invention can be used for a display device, a display and various kinds of light emitting sources. Examples of such a light emitting source include lighting equipment (household lighting, in-vehicle light), a backlight for a watch or liquid crystals, a light source for poster advertisement, a signal or a light memory medium, a light source for an electrophotographic copying machine, a light source for an optical communication processor and a light source for an optical sensor, but are not limited to these. Specifically, it can be effectively used for a backlight for a liquid crystal display and a lighting source.

The color emitted from a compound related to the organic EL device of the present invention or its production method can be determined by the color obtained when applying the result measured by a radiation luminance spectrometer CS-1000 (made by Konica Minolta Sensing Inc.) to CIE chromaticity coordinate, as shown in FIG. 4.16 of "New Edition, Shikisai Kagaku Handbook" (edited by Nippon Shikisai Gakkai, published by Tokyo Univ. Shuppan-kai, 1985).

In cases when the organic EL device of the present invention is a white one, the expression "white" refers to that, when measuring front luminance at a viewing angle of 2 degrees by the foregoing method, the chromaticity in CIE 1931 color specification system falls within the range of X=0.33±0.07 and Y=0.33±0.1. The light-emitting layer of the organic EL device of the present invention preferably contains a host compound and at least one light-emitting dopant as a guest material.

EXAMPLES

In the following, the present invention will be specifically described with reference to examples but the present invention is by no means limited to these. In these examples, the designation "%" represents "% by mass, unless otherwise noted.

Example 1

Preparation of Substrate:

On a commercially available non-alkaline glass substrate was provided a 110 nm thick ITO membrane as a transparent electrode by a sputtering apparatus. Patterning of the ITO was conducted by a photolithography method so as to achieve 4 mm×4 mm emission sites, whereby a substrate was prepared.

Preparation of Organic El Device:

After cleaning the substrate, it was moved under an atmosphere to a clean booth in which cleanliness measured in accordance with ISO 14644-1 was class 5. The substrate was placed on a commercially available spin coater. Poly(3,4-ethylenedioxythiophene)-polystyrene sulfonate (PEDOT/PSS, made by Bayer, Baytron PAI 4083) was diluted two times with ultrapure water and coated under the conditions of 4000 rpm and 30 sec. This substrate was heated at 200° C. for 30 minutes under an atmosphere to provide a hole injection layer. A separately prepared substrate was coated under the same conditions and the layer thickness was proved to be 20 nm. The layer thickness represents a value determined by a laser interferometer.

The foregoing substrate was moved to a gloved box in which cleanliness measured in accordance with ISO 146441 was class 5, the dew-point temperature was not more than −80° C. and an oxygen concentration was 0.8 ppm under a nitrogen atmosphere. The oxygen concentration in the gloved box was a value determined by a galvanic cell type oximeter.

Preparation of Organic EL Devices 1-1 to 1-7:

Preparation of Hole Transport Layers 1-1 to 1-7:

Subsequently, a coating solution for a hole transport layer was prepared, as below, and coated by an applicator of a blade method so as to be a coated liquid layer thickness, as shown in Table 1. The concentration of the coating solution was adjusted in accordance with the individual liquid layer so that the layer thickness remained constant. After being coated and dried, the coated layer was further heated to 120° C. for 30 minutes to provide a hole transport layer. When coating was conducted onto the separately prepared substrate under the same condition, it was proved that the layer thickness was 20 nm. Coating conditions of hole transport layers 1-1 to 1-7 are shown in Table 1. The layer thickness is a value determined by a laser interferometer.

Coating Solution for Hole Transport Layer:

The concentration of polytriphenyldiamine (ADS 254, made by American Dye Source Inc.) was adjusted with chlorobenzene so that the layer thickness was 20 nm.

With regard to devices using hole transport layers 1-1 to 1-7, a light-emitting layer and an electron transport layer were each formed by a process of vapor deposition, as described below.

TABLE 1

| Hole Transport Layer | Solvent | Relative Drying Rate of Solvent (based on butyl acetate = 100) | Boiling point (° C.) | Liquid Layer Thickness (μm) | Time between Completion of Coating and Initiation of Blowing (sec.) | Blowing Rate (m/s) | Remark |
|---|---|---|---|---|---|---|---|
| 1-1 | chlorobebzene | 30 | 132 | 200 | 8 | 3 | Comp. |
| 1-2 | | | | 20 | 80 | 3 | Comp. |
| 1-3 | | | | 20 | 8 | 7 | Comp. |

TABLE 1-continued

| Hole Transport Layer | Solvent | Relative Drying Rate of Solvent (based on butyl acetate = 100) | Boiling point (° C.) | Liquid Layer Thickness (μm) | Time between Completion of Coating and Initiation of Blowing (sec.) | Blowing Rate (m/s) | Remark |
|---|---|---|---|---|---|---|---|
| 1-4 | | | | 20 | 8 | 3 | Inv. |
| 1-5 | | | | 20 | 2 | 3 | Inv. |
| 1-6 | | | | 9 | 2 | 3 | Inv. |
| 1-7 | | | | 9 | 2 | 1 | Inv. |

Preparation of Light-emitting Layer by Vapor Deposition:

The thus prepared hole transport layers were each moved to a vapor deposition processor without being exposed to the atmosphere and the inside thereof was evacuated to $4\times10^{-4}$ Pa. H-A as a host compound, and Ir-A, Ir-1 and Ir-14 as a light-emitting dopant were added into a tantalum resistance heating boat, which was placed into the vapor deposition processor. First, the tantalum resistance heating boat in which H-A, Ir-A, Ir-1 and Ir-14 were placed, was energized to be heated, while being controlled so that the evaporation rates of H-A, Ir-A, Ir-1 and Ir-14 were 0.86, 0.10, 0.02, and 0.02, respectively. Vapor deposition was performed onto the substrate with maintaining such an evaporation rate ratio to provide a 40 nm thick light-emitting layer comprised of H-A, Ir-A, Ir-1 and Ir-14. The layer thickness represents a value determined in the same manner as the hole transport layer.

Preparation of Electron Transport Layer:

The thus prepared light-emitting layers were each moved to a vapor deposition processor without being exposed to the atmosphere and the inside thereof was evacuated to $4\times10^{-4}$ Pa. ET-A was added into a tantalum resistance heating boat, which was placed into the vapor deposition processor. The tantalum resistance heating boat in which ET-A was placed, was energized and heated to form a 30 nm thick electron transport layer comprised of ET-A on the substrate. The layer thickness represents a value determined in the same manner as the hole transport layer.

Subsequently, the substrate provided with an electron transport layer was moved to a vapor deposition processor without being exposed to the atmosphere and the inside thereof was evacuated to $4\times10^{-4}$ Pa.

Potassium fluoride was loaded into a tantalum resistance heating boat and aluminum was added into a tungsten resistance heating boat, which were both placed into the vapor deposition processor.

First, the resistance heating boat in which potassium fluoride was placed, was energized and heated to form, on the substrate, a 3 nm thick electron injection layer comprised of potassium fluoride. Subsequently, the resistance heating boat in which aluminum was placed, was energized and heated to form a 100 nm thick anode comprised of aluminum at a deposition rate of 1 nm/sec. The thickness of the electron injection layer represents a value determined by a laser interferometer. The thickness of the anode represents a value determined by a laser interferometer.

The substrate having formed the anode was moved to a gloved box in which the cleanliness, measured in accordance with ISO 14644-1, was class 5, the dew-point temperature was not more than −80° C. and the oxygen concentration was 0.8 ppm under a nitrogen atmosphere. The oxygen concentration within the gloved box was a value determined by a galvanic cell type oximeter.

Sealing was performed in a glass sealing-can with attached barium oxide as a moisture-retentive agent, whereby a device was prepared. Barium oxide as a moisture-retentive agent was preliminarily prepared by allowing highly pure barium oxide powder, made by Aldrich Corp. to be placed into a glass sealing-can with a fluororesin semipermeable membrane attached with an adhesive (MICROTEX S-NTF 8031Q, made by Nitto Denko Co., Ltd.). A UV curing adhesive is used for adhesion of the organic EL device and a sealing can, both of which are adhered to each other to prepare a sealed device.

Preparation of Organic EL Devices 2-1 to 2-33:

The substrate provided with a hole injection layer was moved to a gloved box in which the cleanliness, measured in accordance with ISO 14644-1, was class 5, the dew-point temperature was not more than −80° C. and the oxygen concentration was 0.8 ppm under a nitrogen atmosphere. The oxygen concentration within the gloved box was a value determined by a galvanic cell type oximeter.

Thereafter, a hole transport layer was formed by a process of vapor deposition, as described below.

Preparation of Hole Transport Layer by Vapor Deposition:

The substrate provided with a hole injection layer was moved to a vapor-depositing machine without exposure to the atmosphere and evacuated to $4\times10^{-4}$ Pa. Poly-triphenyl-diamine (ADS 254, made by American Dye Source Corp.) was added into a tantalum resistance heating boat, which was placed into the vapor deposition processor. The tantalum resistance heating boat to which polytriphenyldiamine was added, was energized and heated to form a 20 nm thick hole transport layer comprised of TPD on the substrate. The layer thickness represents a value determined by a laser interferometer.

Preparation of Light-Emitting Layers 2-1 to 2-33:

Subsequently, a coating solution for a light-emitting layer was prepared as below and coated by an applicator of a blade coating method so that the coated liquid layer thickness was as shown in Tables 2 and 3. The concentration of a coating solution was adjusted in accordance with the individual liquid layer so that the layer thickness remained constant. After being coated and dried, the coated layer was further heated at 150° C. for 30 minutes to provide a light-emitting layer. When coating was conducted onto the separately prepared substrate under the same condition, it was proved that the layer thickness was 420 nm. Coating conditions of light-emitting layers 2-1 to 2-33 are shown in Tables 2 and 3. The layer thickness is a value determined in the same manner as in a hole transport layer.

Coating Solution for Light-emitting Layer:

Using solvents shown in Tables 2 and 3, the concentrations of Ir-A, Ir-1 and Ir-14 were respectively adjusted to 20%, 2% and 0.1% by mass, based on H-A by using solvents shown in Tables 2 and 3 so that the layer thickness was 40 nm.

TABLE 2

| Light-emitting Layer | Solvent | Relative Drying Rate of Solvent (based on butyl acetate = 100) | Boiling Point (° C.) | Liquid Layer Thickness (μm) | Time between Completion of Coating and Initiation of Blowing (sec.) | Blowing Rate (m/s) | Remark |
|---|---|---|---|---|---|---|---|
| 2-1 | diethylene glycol monobutyl ether | less than 1 | 230 | 10 | 15 | 3 | Comp. |
| 2-2 | butyl acetate | 100 | 126 | 120 | 15 | 3 | Comp. |
| 2-3 | | | | 20 | 70 | 3 | Comp. |
| 2-4 | | | | 20 | 15 | 6 | Comp. |
| 2-5 | | | | 20 | 15 | 3 | Inv. |
| 2-6 | | | | 7 | 15 | 3 | Inv. |
| 2-7 | | | | 7 | 8 | 3 | Inv. |
| 2-8 | | | | 7 | 8 | 1 | Inv. |
| 2-9 | | | | 4 | 8 | 0.5 | Inv. |
| 2-10 | isopropyl acetate | 500 | 85 | 120 | 7 | 2 | Comp. |
| 2-11 | | | | 15 | 70 | 2 | Comp. |
| 2-12 | | | | 15 | 7 | 6 | Comp. |
| 2-13 | | | | 15 | 7 | 2 | Inv. |
| 2-14 | | | | 6 | 7 | 2 | Inv. |
| 2-15 | | | | 6 | 2 | 2 | Inv. |
| 2-16 | | | | 6 | 2 | 0.5 | Inv. |
| 2-17 | 1,1-diethoxyethane | 250 | 103 | 120 | 10 | 3 | Comp. |
| 2-18 | | | | 12 | 70 | 3 | Comp. |
| 2-19 | | | | 12 | 10 | 6 | Comp. |
| 2-20 | | | | 12 | 10 | 3 | Inv. |
| 2-21 | | | | 8 | 10 | 3 | Inv. |
| 2-22 | | | | 8 | 10 | 1 | Inv. |

TABLE 3

| Light-emitting Layer | Solvent | Relative Drying Rate of Solvent (based on butyl acetate = 100) | Boiling Point (° C.) | Liquid Layer Thickness (μm) | Time between Completion of Coating and Initiation of Blowing (sec.) | Blowing Rate (m/s) | Remark |
|---|---|---|---|---|---|---|---|
| 2-23 | acetone | 1160 | 56 | 6 | 7 | 2 | Comp. |
| 2-24 | butyl acetate | 100 | 126 | 0.5 | 8 | 0.5 | Comp. |
| 2-25 | butyl acetate | 100 | 126 | 7 | 8 | 0.05 | Comp. |
| 2-26 | butyl acetate isopropyl acetate | 300 | 100 | 7 | 8 | 3 | Inv. |
| 2-27 | 3,5,5-trimethyl-2-cyclohexene-1-one | 3 | 215 | 7 | 8 | 3 | Inv. |
| 2-28 | 1,2-dichloroethane | 980 | 83.5 | 7 | 8 | 3 | Inv. |
| 2-29 | isopropyl acetate | 500 | 85 | 1.5 | 2 | 2 | Inv. |
| 2-30 | isopropyl acetate | 500 | 85 | 95 | 2 | 2 | Inv. |
| 2-31 | isopropyl acetate | 500 | 85 | 6 | 55 | 2 | Inv. |
| 2-32 | isopropyl acetate | 500 | 85 | 6 | 2 | 0.1 | Inv. |
| 2-33 | isopropyl acetate | 500 | 85 | 6 | 2 | 4.8 | Inv. |

Then, an electron transport layer was provided in the same manner as in the foregoing organic EL devices 1-1 to 1-7, and further, sealed devices were prepared in the same manner as in the organic EL devices 1-1 to 1-7.

Preparation of Organic EL Devices 3-1 to 3-6:

The substrate provided with a hole injection layer was moved to a gloved box in which the cleanliness measured in accordance with ISO 14644-1 was class 5, the dew-point temperature was not more than −80° C. and then oxygen concentration was 0.8 ppm under a nitrogen atmosphere. The oxygen concentration within the gloved box was a value determined by a galvanic cell type oximeter.

Then, a hole transport layer and a light-emitting layer were each formed in the same manner as described earlier.

Preparation of Electron Transport Layers 3-1 to 3-6:

Subsequently, a coating solution for an electron transport layer was prepared as below and coated by an applicator of a blade coating method so as to be a coated liquid layer thickness, as shown in Table 4. The concentration of a coating solution was adjusted in accordance with the individual liquid layer so that the layer thickness remained constant. After being coated and dried, the coated layer was further heated at 150° C. for 30 minutes to provide an electron transport layer. When coating was conducted onto the separately prepared substrate under the same condition, it was proved that the layer thickness was 30 nm. Coating conditions of electron transport layers 3-1 to 3-6 are shown in Table 4. The layer thickness is a value determined in the same manner as in the hole transport layer.

Coating Solution for Electron Transport Layer:

The concentration of ET-A was adjusted with 2,2,3,3-tetrafluoropropanol so that the layer thickness was 30 nm.

TABLE 4

| Light-emitting Layer | Solvent | Relative Drying Rate of Solvent (based on butyl acetate = 100) | Boiling Point (° C.) | Liquid Layer Thickness (μm) | Time between Completion of Coating and Initiation of Blowing (sec.) | Blowing Rate (m/s) | Remark |
|---|---|---|---|---|---|---|---|
| 3-1 | 2,2,3,3-tetrafluoropropanol | 20 | 108 | 110 | 20 | 4 | Comp. |
| 3-2 |  |  |  | 10 | 70 | 4 | Comp. |
| 3-3 |  |  |  | 10 | 20 | 7 | Comp. |
| 3-4 |  |  |  | 10 | 20 | 4 | Inv. |
| 3-5 |  |  |  | 4 | 20 | 4 | Inv. |
| 3-6 |  |  |  | 4 | 20 | 1 | Inv. |

H-A

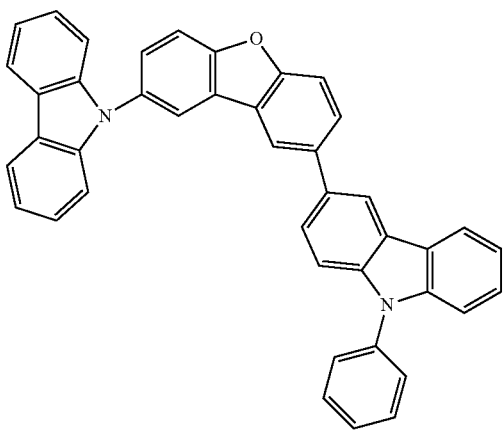

Ir-A

ET-A

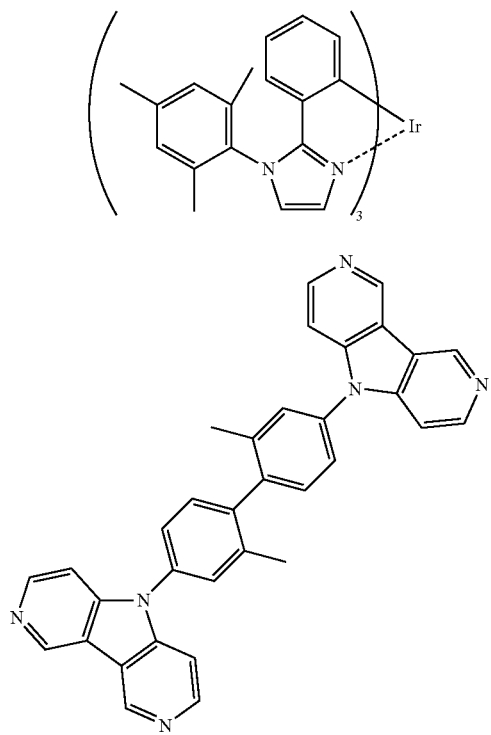

There were prepared organic EL devices 4-1 to 4-3, having the constitution shown in Table 8.

Evaluation

Coating Uniformity:

Using a direct current source (stabilized Direct Current Source PA 13-B, made by TEXIO Co., Ltd.), the individual devices were each allowed to emit light and their light-emitting surfaces thereof were observed by using a microscope (MS-804, lens A-1468, made by MORITEX Co., Ltd.). The overall light-emitting surface (4 mm square) was visually observed and evaluated based on the following criteria. The evaluation results are shown in Tables 5, 6, 7 and 8, in which ranks "4" and "2" represent an intermediate between ranks "5" and "3", and an intermediate between ranks "3" and "1":

5: No non-uniformity was observed and no problems in practice,

3: Slight non-uniformity was observed but no problem in practice,

1: Marked non-uniformity was observed and being problem in practice.

External Quantum Efficiency:

The prepared organic El devices were measured with respect to external quantum efficiency (%) when a constant-current was applied. Measurement was conducted by using a spectral radiation luminance meter (made by Konica Minolta Sensing Inc.). The thus obtained results are shown in Tables 5, 6, 7 and 8, wherein the external quantum efficiency was represented by a relative value, based on the measured value of organic EL device 1-4 being 100.

TABLE 5

| Organic EL Device | Hole Transport Layer | Light-emitting Layer | Electron Transport Layer | Coating Uniformity | External Quantum Efficiency | Remark |
|---|---|---|---|---|---|---|
| 1-1 | 1-1 | vapor deposition | vapor deposition | 1 | 50 | Comp. |
| 1-2 | 1-2 | vapor deposition | vapor deposition | 2 | 20 | Comp. |
| 1-3 | 1-3 | vapor deposition | vapor deposition | 1 | 80 | Comp. |
| 1-4 | 1-4 | vapor deposition | vapor deposition | 3 | 100 | Inv. |
| 1-5 | 1-5 | vapor deposition | vapor deposition | 4 | 120 | Inv. |
| 1-6 | 1-6 | vapor deposition | vapor deposition | 5 | 120 | Inv. |
| 1-7 | 1-7 | vapor deposition | vapor deposition | 5 | 140 | Inv. |

TABLE 6

| Organic EL Device | Hole Transport Layer | Light-emitting Layer | Electron Transport Layer | Coating Uniformity | External Quantum Efficiency | Remark |
|---|---|---|---|---|---|---|
| 2-1 | vapor deposition | 2-1 | vapor deposition | 1 | 20 | Comp. |
| 2-2 | vapor deposition | 2-2 | vapor deposition | 1 | 60 | Comp. |
| 2-3 | vapor deposition | 2-3 | vapor deposition | 2 | 30 | Comp. |
| 2-4 | vapor deposition | 2-4 | vapor deposition | 1 | 100 | Comp. |
| 2-5 | vapor deposition | 2-5 | vapor deposition | 3 | 100 | Inv. |
| 2-6 | vapor deposition | 2-6 | vapor deposition | 4 | 120 | Inv. |
| 2-7 | vapor deposition | 2-7 | vapor deposition | 4 | 120 | Inv. |
| 2-8 | vapor deposition | 2-8 | vapor deposition | 5 | 140 | Inv. |
| 2-9 | vapor deposition | 2-9 | vapor deposition | 5 | 160 | Inv. |
| 2-10 | vapor deposition | 2-10 | vapor deposition | 1 | 50 | Comp. |
| 2-11 | vapor deposition | 2-11 | vapor deposition | 2 | 60 | Comp. |
| 2-12 | vapor deposition | 2-12 | vapor deposition | 1 | 90 | Comp. |
| 2-13 | vapor deposition | 2-13 | vapor deposition | 3 | 120 | Inv. |
| 2-14 | vapor deposition | 2-14 | vapor deposition | 4 | 140 | Inv. |
| 2-15 | vapor deposition | 2-15 | vapor deposition | 5 | 170 | Inv. |
| 2-16 | vapor deposition | 2-16 | vapor deposition | 5 | 180 | Inv. |
| 2-17 | vapor deposition | 2-17 | vapor deposition | 1 | 20 | Comp. |
| 2-18 | vapor deposition | 2-18 | vapor deposition | 2 | 40 | Comp. |
| 2-19 | vapor deposition | 2-19 | vapor deposition | 1 | 70 | Comp. |
| 2-20 | vapor deposition | 2-20 | vapor deposition | 3 | 90 | Inv. |
| 2-21 | vapor deposition | 2-21 | vapor deposition | 3 | 100 | Inv. |
| 2-22 | vapor deposition | 2-22 | vapor deposition | 4 | 110 | Inv. |
| 2-23 | vapor deposition | 2-23 | vapor deposition | 1 | 130 | Comp. |
| 2-24 | vapor deposition | 2-24 | vapor deposition | 1 | 40 | Comp. |
| 2-25 | vapor deposition | 2-25 | vapor deposition | 4 | 30 | Comp. |
| 2-26 | vapor deposition | 2-26 | vapor deposition | 5 | 170 | Inv. |
| 2-27 | vapor deposition | 2-27 | vapor deposition | 4 | 100 | Inv. |
| 2-28 | vapor deposition | 2-28 | vapor deposition | 5 | 160 | Inv. |
| 2-29 | vapor deposition | 2-29 | vapor deposition | 3 | 130 | Inv. |
| 2-30 | vapor deposition | 2-30 | vapor deposition | 3 | 120 | Inv. |
| 2-31 | vapor deposition | 2-31 | vapor deposition | 4 | 110 | Inv. |
| 2-32 | vapor deposition | 2-32 | vapor deposition | 5 | 120 | Inv. |
| 2-33 | vapor deposition | 2-33 | vapor deposition | 4 | 150 | Inv. |

TABLE 7

| Organic EL Device | Hole Transport Layer | Light-emitting Layer | Electron Transport Layer | Coating Uniformity | External Quantum Efficiency | Remark |
|---|---|---|---|---|---|---|
| 3-1 | vapor deposition | vapor deposition | 3-1 | 1 | 50 | Comp. |
| 3-2 | vapor deposition | vapor deposition | 3-2 | 2 | 40 | Comp. |
| 3-3 | vapor deposition | vapor deposition | 3-3 | 1 | 80 | Comp. |
| 3-4 | vapor deposition | vapor deposition | 3-4 | 3 | 100 | Inv. |
| 3-5 | vapor deposition | vapor deposition | 3-5 | 4 | 120 | Inv. |
| 3-6 | vapor deposition | vapor deposition | 3-6 | 5 | 140 | Inv. |

TABLE 8

| Organic EL Device | Hole Transport Layer | Light-emitting Layer | Electron Transport Layer | Coating Uniformity | External Quantum Efficiency | Remark |
|---|---|---|---|---|---|---|
| 4-1 | 1-7 | 2-9 | 3-6 | 5 | 170 | Inv. |
| 4-2 | vapor deposition | 2-9 | 3-6 | 5 | 165 | Inv. |
| 4-3 | 1-7 | 2-9 | vapor deposition | 5 | 165 | Inv. |

As is apparent from Table 5, it was proved that organic EL devices 1-4 to 1-7, in which the hole transport layer was prepared in accordance with the production method of the present invention, were each superior in any of coating uniformity and external quantum efficiency to comparative devices.

As is shown in Tables 6 and 7, it was proved that organic El devices in which the light-emitting layer and the electron transport layer were prepared in accordance with the production method of the present invention, were each superior in both coating uniformity and external quantum efficiency to comparative devices.

As is shown in Table 8, it was proved that organic El devices in which at least two of a hole transport layer, a light-emitting layer and an electron transport layer were prepared in accordance with the production method of the present invention, were each excellent in both coating uniformity and external quantum efficiency.

It was further proved that superior effects were similarly achieved when organic EL devices were prepared in the same manner as organic EL device 2-4, except that the compound used for the coating solution for a hole injection layer was replaced by a ferrocene compound disclosed in JP 06-025658 A, a star burst type compound disclosed in JP 10-233287 A, a triarylamine compound disclosed in JP 2000-068058A or 2004-006321A, a compound including a sulfur-containing cycle disclosed in JP 2002-117979 A, or a hexaazatriphenylene compound disclosed in US 2002/0158242 A, US 2006/0251922 A, or JP 2006-049393 A and there was used a solvent containing the same substituent as that of each of the foregoing compounds.

Further, in preparation of the organic El device 2-20, even when the coating method of a solution was replaced by a dip coating method, a spin coating method or a slit coating method, similar superior effects were achieved.

What is claimed is:

1. A method of producing an organic electroluminescence device comprising at least a layer, and the layer being formed by a wet process comprising the steps of:

coating a solution of an organic material dissolved in a solvent to form a liquid layer having a thickness of 1 μm to 100 μm, the solvent having a relative drying rate compared to butylacetate of 1 to 1000 (based on a dry rate of butylacetate being 100) and the organic material being a low molecular weight compound having a molecular weight of 300 to 1600; and then removing the solvent by blowing air onto the liquid layer at an air-blowing rate from 0.1 m/s to 5 m/s and a time between completion of coating and initiation of blowing is from 0 sec. to 60 sec, to form the layer and the layer is a light-emitting layer.

2. The method of producing an organic electroluminescence device, as claimed in claim 1, wherein the solvent exhibits a boiling point of not less than 40° C. and less than 200° C.

3. The method of producing an organic electroluminescence device, as claimed in claim 1, wherein the solvent is a mixture of at least a solvent exhibiting a relative drying rate of less than 50 in combination with a solvent exhibiting a relative drying rate of not less than 200.

4. The method of producing an organic electroluminescence device, as claimed in claim 1, wherein the step of coating is performed by a dip coating method, a spin coating method, a blade coating method, or a slit coating method.

5. An electroluminescence device produced by a method of producing an organic electroluminescence device, as claimed in claim 1.

* * * * *